United States Patent [19]

Tsukagoshi et al.

[11] Patent Number: 5,001,542
[45] Date of Patent: Mar. 19, 1991

[54] COMPOSITION FOR CIRCUIT CONNECTION, METHOD FOR CONNECTION USING THE SAME, AND CONNECTED STRUCTURE OF SEMICONDUCTOR CHIPS

[75] Inventors: Isao Tsukagoshi, Shimodate; Yutaka Yamaguchi, Yuki; Atsuo Nakajima, Ibaraki; Yasushi Goto, Shimodate, all of Japan

[73] Assignee: Hitachi Chemical Company, Tokyo, Japan

[21] Appl. No.: 443,169

[22] Filed: Nov. 30, 1989

[30] Foreign Application Priority Data

| Dec. 5, 1988 | [JP] | Japan | 63-307618 |
| Jan. 12, 1989 | [JP] | Japan | 01-005540 |
| Jan. 12, 1989 | [JP] | Japan | 01-005541 |
| Mar. 22, 1989 | [JP] | Japan | 01-069973 |

[51] Int. Cl.$^5$ .................. H01L 23/14; H01L 23/50; H01L 23/54
[52] U.S. Cl. .................. 357/68; 757/72; 757/67; 757/80
[58] Field of Search .................. 357/67, 72, 73, 79, 357/80; 437/24, 183, 184, 185, 209; 428/901, 929, 327, 407

[56] References Cited

U.S. PATENT DOCUMENTS

| 4,423,435 | 12/1983 | Test, II | 357/65 |
| 4,654,752 | 3/1987 | Kyle | 361/386 |
| 4,680,226 | 7/1987 | Takeda | 428/327 |
| 4,731,282 | 3/1988 | Tsukagoshi et al. | 428/929 |

FOREIGN PATENT DOCUMENTS

| 0242025 | of 0000 | European Pat. Off. |
| A-0110307 | 11/1983 | European Pat. Off. |
| A-0205686 | 6/1985 | European Pat. Off. |
| 2505543 | 5/1982 | France |
| 51-101469 | 9/1976 | Japan |
| A-2089126 | 12/1981 | United Kingdom |

OTHER PUBLICATIONS

Bolger & Mooney, "Die Attah in Hi-Rel P-Dips: Polyimides or Low Chloride Epoxies?" IEEE Transactions on Components, Hybrids and Manufacturing Technology CHMT-7 (1984) Dec., No. 4, New York, U.S.A.

*Primary Examiner*—Rolf Hille
*Assistant Examiner*—S. V. Clark
*Attorney, Agent, or Firm*—Antonelli, Terry, Stout & Kraus

[57] ABSTRACT

A composition comprising (A) an epoxy resin type adhesive, (B) particles obtained by coating a nucleus of a curing agent with a film, (C) pressure-deformable electroconductive particles having an average particles size larger than that of the particles (B), and if necessary (D) rigid particles having an average particle size smaller than that of the particles (B), is effective for connecting circuits electrically or connecting a semiconductor chip to a wiring substrate.

14 Claims, 3 Drawing Sheets

COMPOSITION FOR CIRCUIT CONNECTION, METHOD FOR CONNECTION USING THE SAME, AND CONNECTED STRUCTURE OF SEMICONDUCTOR CHIPS

BACKGROUND OF THE INVENTION

This invention relates to a composition for circuit connection used for electrically connecting up-and-down confronting circuits and bonding and fixing them, as well as to a circuit-connecting method using said composition and a connected structure of semiconductor chips.

As the size of electronic parts becomes smaller and their thickness becomes thinner, the circuit used therein has become higher in density and fineness. Since the existing solder and rubber connector are incapable of coping with connection of these minute circuits, anisotropically electroconductive adhesive and film (hereinafter referred to as "connecting materials") have become used largely in the recent time.

As one of the connecting materials, there is known an anisotropically electroconductive adhesive which contains electrically conductive particles in an insulating adhesive in an amount enough to form electroconductive route only in the direction of thickness when volume is decreased in the direction of thickness by applying a pressure.

In putting this adhesive to use, an adhesive material layer is provided between the confronting circuits and pressure is applied or heat and pressure are applied to the adhesive layer, whereby the up and down circuits are electrically connected and adjacent circuits are insulated and the circuits are bonded and fixed in this state.

As such an adhesive, a thermoplastic composition comprising styrene-butadiene-styrene block copolymer or the like as a base polymer has been used from the viewpoint of convenience at the time of use.

As the field to which the adhesive material is applied becomes wider, however, it has become desired to enlarge the use temperature range by improving heat resistance and to improve applicability to fine circuits and reliability by enhancing adhesive strength. Since such desires cannot be satisfied by the existing thermoplastic compositions, the use of curing reaction system has been attempted.

On the other hand, in the field of electroconductive materials, it has been known to use rigid materials such as carbon, nickel, thermally fusible metal and the like as a filler. Some of the inventors of the present invention previously proposed the use of an electroconductive filler prepared by coating the surface of a polymeric nuclear material with a metallic thin layer of which thermal expansion coefficient and elastic modulus are close to those of the adhesive used for connection of circuits (hereinafter, such a filler is referred to as "pressure-deformable electroconductive particle") (Japanese Patent Application No. 61-31088). According to this method, electroconductive material and adhesive undergo nearly equal expansion and shrinkage upon temperature change of connected part and therefore the electroconductive material satisfactorily follows the change in the gap between connected circuits so that the change in connection resistance is small. This, reliability of connection can be greatly improved as compared with the case using a rigid electroconductive material different from adhesive in thermal expansion coefficient and elastic modulus.

Although the use of a curing type adhesive as the adhesive constructing connecting part is very effective for improving heat resistance and adhesive strength, this method is disadvantageous in that the connected product shows great dispersion and is unstable with regard to the connection resistance between up and down circuits.

It has been found that the unstability of connection resistance is attributed to that a slow reaction progresses between adhesive and curing agent during storage of connecting material to decrease fluidity of the adhesive and thereby the insulating adhesive becomes unable to be sufficiently removed from surface of electroconductive particle or to that a curing reaction of adhesive takes place upon the heating or pressing to enhance viscosity of the adhesive before the conductive particles come into a sufficient contact with circuit and thereby the electroconductive particles and circuits are connected in a state of insufficient contact. It has been found that such an insufficient contact is particularly remarkable when the electroconductive particle is a pressure-deformable particle.

Another problem involved in curing reaction system is the difficulty to reuse insufficiently connected parts. Thus, in curing reaction system, the connected part is solidly bonded and the adhesive forms a network (crosslinkage), so that heating cannot bring about a sufficient decrease in bonding force and the cured adhesive is insoluble into solvent, which makes it quite difficult to peel off the insufficiently connected parts.

Accordingly, the connected part must be removed by a forcible means such as swelling and peeling by the use of solvent or chemical agent such as acid, alkali or the like or peeling-off by means of knife.

However, these forcible means injure the neighboring normally connected part and wirings, too. and a part of the adhesive inevitably remains on the surface, and therefore re-connection of high reliability is unexpectable.

It has been attempted to electrically connect semiconductor chips to circuit board by the use of the above-mentioned connecting materials.

For example, Japanese Patent Application Kokai (Laid-Open) No. 51-101469 disclosed a method for electrically connecting and bonding the bump provided on semiconductor chip to the connection terminal of the corresponding base board through intermediation of the electroconductive particles contained in anisotropic electroconductive adhesive, and Japanese Patent Application Kokai (laid-Open) No. 61-194731 disclosed a method for electrically connecting and bonding an electrode depressed from the surface of protecting layer provided on semiconductor chip to a bump provided on connecting terminal of circuit board by the use of an insulating adhesive or an anisotropic electroconductive adhesive by pressing and mutually contacting them.

However, at the present stage, these methods have not yet reached a level of practical mass production because of unsatisfactory reliability of connecting material.

The methods for electrically connecting a semiconductor chip to circuit board by the use of a connecting material disclosed in Japanese Patent Application Nos. 51-101469 and 61-194731 are quite excellent methods because they enable to realize a real connection by adhesive, and thereby they can cope with the tendency of decreasing the size of instruments and making circuits finer.

In these methods, however, a protruding or projecting electrode (bump) made of gold or solder and having a height of about 5 to 30 microns must be formed on at least one of the electrode of semiconductor chip and connection terminal of circuit board. Formation of uniform bumps on many fine circuits, generally having a line width of several to several tens microns, is disadvantageous in that it requires to provide a clean room of large scale and to use complicated high techniques such as formation of barrier metal layer, photolithography, plating, etching and the like, and it consumes a large quantity of expensive metals.

The main surface of semiconductor chip, not forming bump, is covered with an insulating material such as inorganic material (e.g. solicon oxide, boron nitride and the like) or polyimide type organic material (hereinafter, this layer of insulating material is referred to as "protecting layer"), and the electrode surface of semiconductor chip is usually provided concavely as compared with the level of this main surface.

Accordingly, for carrying out connection by the use of a connecting material such as anisotropic electroconductive adhesive or the like, a bump must be formed on at least one of the electrode part of semiconductor chip and connection terminal of circuit board as has been mentioned above. If no bump is formed on them (hereinafter, this state is referred to as "bumpless state"), connection has been impossible hitherto for the following reason. That is, in the electrode part, the electrode part is concave as compared with the level of main surface, so that the anisotropic electroconductive adhesive present in said part undergoes no pressure and its volume does not decrease even at the time of pressing for connection and hence no electricity-conducting route can be formed in the direction of thickness (from an electrode to an electrode). In the protecting layer part, pressure is concentrated into the contact part of particles, so that in case of usual rigid electroconductive particles breakage of semiconductor chip and protecting layer takes place.

In case of connecting a semiconductor chip having bump on main surface to a circuit base board, the following problem appears. That is, when a connecting material containing electroconductive particles such as anisotropic electroconductive adhesive is used, the connection at a small-area part such as bump is insufficient in reliability. The area of connection part in bump is usually as small as 100 micron square or less and the number of bumps on one chip is usually 100 or more, and the area of bump is more and more decreasing, aiming at higher fineness. If the amount of conductive particle is increased for the sake of improving the reliability of connection in minute area, short-circuit takes place between adjacent bumps. Thus, there has been a limit in the reliability of connection in minute area.

In addition, when the conductive particle is a rigid particle such as carbon or nickel particle, the pressure applied at the time of connection causes breakage of semiconductor chip due to stress or causes breakage in the protecting layer of circuit, and thereby the function of semiconductor chip is lost.

In case of connection using an insulating adhesive containing no conductive particle, connection is realized by the mutual contact of minute concavities and convexities, so that reliability of connection is deteriorated by the unevennesses in the flatness of circuit on board and bump height of semiconductor chip.

SUMMARY OF THE INVENTION

This invention provides a composition for circuit connection having a stable connection resistance and a high reliability, as well as a method for connecting circuits with said composition and a connected structure of semiconductor chips.

Thus, this invention relates to a composition for circuit connection comprising:
(A) an epoxy resin-containing reactive adhesive,
(B) coated particles obtained by substantially coating a nucleus of curing agent with a film, and
(C) electroconductive particles capable of being deformed by applying a pressure and having an average particle size larger than that of the coated particle (B), as indispensable ingredients.

This invention further provides a composition containing a gap regulator (a material for regulating the gap between connected circuits) suitable for use in this system, a method for connecting circuits by the use of such a composition, and a connected structure of semiconductor and circuit base board.

This invention still further provides a process for connecting circuits, which comprises
placing the composition mentioned above between circuits facing oppositely,
conducting electric current passing test for both circuits while pressing in an uncured state of the composition, and
curing the composition under pressure to obtain electrical connection.

DESCRIPTION OF THE PREFERRED EMBODIMENTS

Hereunder, this invention will be explained with reference to the drawings.

Figure 1A:
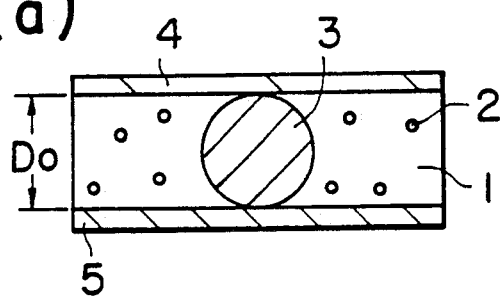
FIG. 1 is a sectional diagram illustrating the state of circuit connection using the composition of this invention.
Figure 1B:
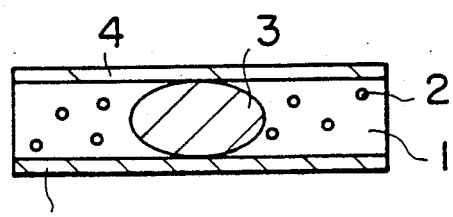
Figure 1C:
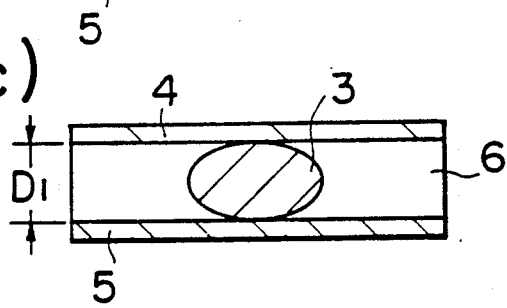
Figure 2:
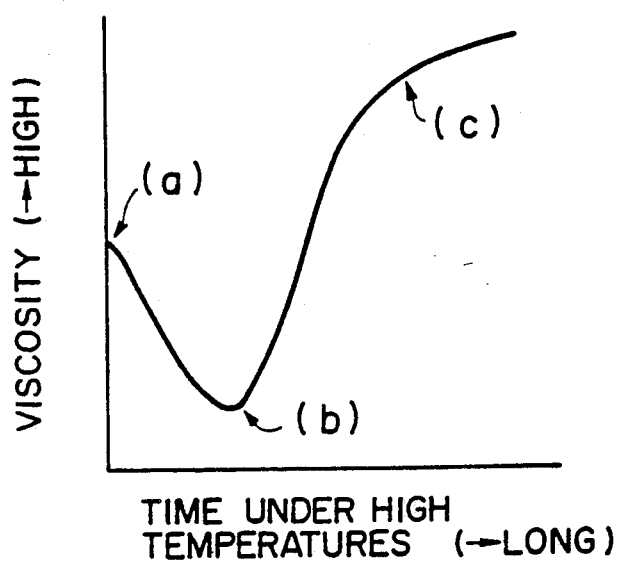
FIG. 2 is a schematic graph illustrating the viscosity change of the adhesive of this invention at the time of connection.

FIG. 1 is a sectional diagram illustrating the state of circuit connection part using the composition of this invention; and FIG. 2 is a schematic graph illustrating the viscosity change of adhesive at the time of circuit connection; wherein (a) to (c) in FIGS. 1 and 2 are symbols denoting the steps in the connection.

In FIGS. 1 and 2, the mark (a) illustrates a state that a connecting material consisting of reactive adhesive 1, coated particles 2 and pressure-deformable electroconductive particles 3 having a greater particle diameter than that of coated particle 2 is formed between the up and down circuits 4 and 5.

As the means for the formation of connecting material on circuit, coating or printing process can be adopted when the connecting material is a liquid, while putting a connecting material on circuit can be adopted when the connecting material is a solid material such as a film.

The mark (b) illustrates a state that viscosity of the reactive adhesive 1 has descended due to the temperature elevation caused by the heating and pressing at the time of connection and the pressure-deformable electroconductive particles 3 has been deformed by the pressure between circuits 4 and 5. At this time, coated particles 2 are less susceptible to deformation than pressure-deformable electroconductive particles 3 because the former are smaller than the latter in particle diameter. Further, since they are dispersed in adhesive, heat conduction from circuit is slow. Thus, coated particles 2 are difficult to break, and their nuclear material (curing agent) keeps inert.

At this time, pressure-deformable electroconductive particles 3 are deformed and mutually contacted between circuits 4 and 5 so that electrical continuity can be realized between 4 and 5. Accordingly, it is possible to put in operation a continuity test in this state. According to this method, regeneration (taking-out and re-connection) of defective parts which has so far been difficult to practice can be effected quite easily in the state of uncured adhesive can be effected.

The mark (c) illustrates the state that a period of time has passed after the heating and pressing at the time of connection. Due to the lapse of time, coated particles 2 reach a higher temperature and the coating layer is broken due to swelling pressure of nuclear material and melting of film, as the result of which the nuclear material (curing agent) comes into contact or is integrated with reactive adhesive 1. Thus, viscosity of adhesive ascends, and the adhesive is transformed into a cured adhesive 6 meanwhile. At this time, the pressure-deformable electroconductive particles 3 existing between up and down circuits 4 and 5 have already been deformed and can sufficiently be contacted with the circuits, and they can be immobilized in this state by the cured adhesive 6.

Figure 3:
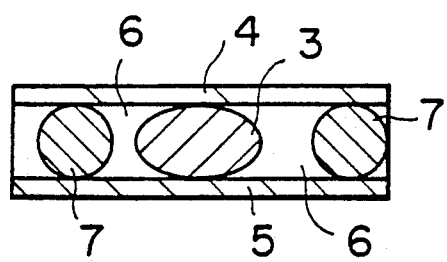
FIG. 3 is a sectional diagram illustrating the state of circuit connection using another composition of this invention.

At this time, rigid particles 7 of which particle diameter is smaller than that of pressure-deformable electroconductive particle 3, such as electroconductive particle made of nickel, silver or the like or insulating particle such as spherical or milled fibrous particle made of ceramic, glass, silica or the like or particle of rigid resin, can be used either alone or in combination as shown in FIG. 3 as a gap regulating material between up and down circuits 4 and 5. For this purpose, the rigid particle 7 is preferably a uniform particle having a sharp particle size distribution, and its amount is appropriately selected from a range of 15% by volume or less based on the reactive adhesive. If its amount exceeds 15% by volume, adhesive force to circuit is deteriorated. In order to cope with the tendency of making a finer circuit, it is preferable to use an insulating particle of which mean particle diameter is smaller than the distance between adjacent circuits.

The mean particle diameter referred to in this invention can be obtained according to the following equation (1):

$$D = \Sigma nd/\Sigma n \quad (1)$$

wherein n is number of particles having a particle diameter of d. As the method for visually examining the particles, electron microscopic method, optical microscopic method, call counter method, light scattering method and the like are generally adopted. In this invention, electron microscopic method is used. When the particle has some aspect ratio, d expresses the longer diameter.

Next, the materials used in this invention will be explained below.

The materials which can be used as reactive adhesive (A) of this invention include synthetic resins such as epoxy resin, urea resin, melamine resin, guanamine resin, phenolic resin, xylene resin, furan resin, diallyl resin, phthalate resin, bis-maleimide resin, triazine resin, polyester resin, polyurethane resin, polyvinyl butyral resin, phenoxy resin, polyamide resin, polyimide resin, cyanoacrylate resin and the like and rubbers or elastomers having a functional group such as carboxyl group, hydroxyl group, vinyl group, amino group, epoxy group or the like. These reactive adhesives can be used either alone or in the form of a mixture of two or more members.

Among these reactive adhesives, the so-called epoxy adhesives, i.e. epoxy resin itself or adhesive compositions comprising an epoxy resin as at least one ingredient thereof, are preferable because they are rapid-curing and can give a cured product well balanced in many properties. Typical examples of said epoxy resin include bisphenol type epoxy resin derived from epichlorohydrin and bisphenol A, bisphenol F or the like and epoxy novolac resin derived from epichlorohydrin and phenol novolac or cresol novolac. Apart from them, a variety of epoxy compounds having two or more oxirane rings in one molecule such as glycidylamine, glycidyl ester, alicyclic epoxy compounds, heterocyclic epoxy compounds and the like are also usable.

These epoxy compounds can be used either alone or in the form of a mixture of two or more members. For example, a combined use of a liquid epoxy resin and a solid epoxy resin is desirable from the viewpoint of film-formability and fluidity-controllability at the time of connection. Combined use of an epoxy compound and a thermoplastic polymer is also desirable from the viewpoint of giving flexibility to adhesive. From the viewpoint of protecting the connected circuit against corrosion, it is more preferable to use the so-called high-purity epoxy compound of which impurity ions ($Na+$, $K+$, $Cl^3$, $S_4^2$, etc.) content and hydrolyzable chlgrine content have been reduced to 300 ppm or below respectively, and it is more preferable to use the so-called superhigh-purity product of which contents of these substances have been reduced to 100 ppm or below, respectively. Since the above-mentioned impurity ions can disturb the curing reaction of epoxy resin, the use of high-purity products is preferred from this point of view, too. That is, the use of high-purity products brings about a rapid cure, and this is preferable from the viewpoint of workability of connection.

Into the reactive adhesive, curing accelerator and curing catalyst may be incorporated, and curing agent and crosslinking agent may also be incorporated so far as their addition does not exercise an adverse influence upon shelf stability of adhesive.

The adhesive may also contain general additives such as solvent, dispersing medium, tackifier, filler, ultraviolet absorber, autoxidant, polymerization inhibitor, coupling agent, and the like.

Coated particle (B) comprises a curing agent as a nucleus which is substantially covered with a thin film of an polymeric substance such as polyurethane, polystyrene, gelatin, polyisocyanate or the like, an inorganic substance such as calcium silicate or the like, or a metal such as nickel, copper or the like. Its mean particle diameter must be smaller than that of pressure-deformable electroconductive particle 3 not yet deformed, and it is preferably 80% or below and more preferably 50% or below as compared with that of 3. Though the shape of coated particle (B) is not critical, a smaller aspect ratio is more desirable because it gives a more uniform reactivity. As the curing agent used as nuclear material, substances known as curing agent of reactive adhesive (A) can be used in an appropriate amount.

For example, curing agents which can be used for epoxy resin include aliphatic amines, aromatic amines, carboxylic acid anhydrides, thiols, alcohols, phenols, isocyanates, tertiary amines, boron complexes, inorganic acids, hydrazides, imidazoles, and modified products thereof.

Among them, tertiary amines, boron complexes, hydrazides and imidazoles are preferable, because they bring about a rapid cure, are excellent in connection workability and less require the stoichiometric consideration owing to their ion-polymerization type catalytic performance. They can be used either alone or in the form of a mixture of two or more members.

Preferably, the curing reaction using the coated particle should be completed at the time of connection. Practically, however, it is enough for the purpose if the reaction can progress to such an extent that the deformation of deformable electroconductive particles can be maintained between circuits, because a post-cure may be carried out in this state.

As the coated particle (B), thermal activation type of coated particle in which the coating film is broken at a predetermined temperature is more desirable than pressure activation type of coated particle in which coating film is broken by a pressure, because the former gives a more uniform reaction system than the latter. Coated particles having a thermal activation temperature of 40° C. to 250° C. can be used in this invention. If this temperature is lower than 40° C., the coated particle tends to be activated in the course of storage, and therefore such a product must be stored with cooling. If the temperature is lower than 40° C., the coated particle tends be applied at the time of connection, which tends to thermally injure the neighboring materials. For these reasons, the thermal activation temperature is preferably 70° C. to 200° C., and more preferably 100° C. to 170° C.

The thermal activation temperature referred to in this invention means the exothermic peak temperature measured by elevating the temperature of adhesive composition 1 from ambient temperature at a rate of 10° C./minute in a differential scanning calorimeter (DSC).

Figure 4:
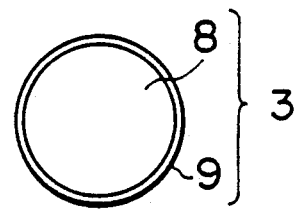
FIG. 4 is a sectional diagram illustrating the deformable electroconductive particle suitable for use in this invention.

The pressure-deformable electroconductive particle (C) is a particle prepared by coating the surface of a polymeric material such as polystyrene, epoxy resin or the like with an electroconductive metallic thin layer 9 made of a metal such as nickel, gold, silver, copper, solder or the like having a thickness of, for example, 1 micron or below as shown in FIG. 4. As has been mentioned above, its particle diameter must be greater than that of coated particle (B).

This pressure-deformable electroconductive particle must change its form under the condition of heating and pressing at the time of connection. As the conditions of the heating and pressing, a temperature of 250° C. or below and a pressure of 100 kg/cm$^2$ or below are usually adopted. Since a higher temperature and a higher pressure have a greater tendency of thermally injuring the circuit material and the like, a temperature of 200° C. or below and a pressure of 50 gk/cm$^2$ or below are preferable.

For confirming the deformation of electroconductive particle 3, electron microscopic observation of sectional area of connected structure is effective. As to the extent of the deformation, a quantity D expressed by the following formula (2) must be equal to 0.9 or below and preferably 0.7 or below:

$$D = (D_O - D_1)/D_1 \quad (2)$$

wherein $D_O$ is a particle size before deformation and $D_1$ is a particle size after deformation.

As the polymeric nuclear material 8, plastics such as polystyrene, epoxy resin and the like, rubbers such as styrene-butadiene rubber, silicone rubber and the like, and natural polymers such as cellulose, starch, squalene and the like can be used. These materials are used as main component of the nuclear material, and various additives such as crosslinking agent, curing agent, antioxidant and the like may optionally be added thereto.

As the metal constituting the thin layer 9, a variety of electrically conductive metals, metallic oxides, alloys and the like can be used.

Examples of said metal include Zn, Al, Sb, Au, Ag, Sn, Fe, Cu, Pb, Ni, Pd, Pt and the like, and they may be used either alone or in the form of a composite material (e.g. solder). Further, for special purposes such as control of hardness and surface tension or improvement of adhesion, other metals such as Mo, Mn, Cd, Si, Ta, Cr and the like and their compounds may be added thereto.

From the viewpoint of electrical conductivity and corrosion resistance, Ni, Ag, Au, Sn, Cu and Pb are preferred. These materials are used either as a single layer or as a multi-layer.

As the method for forming metal thin layer 9 on polymeric nuclear material 8, dry methods such as vapor deposition, sputtering, ion plating, flame spraying and the like and plating methods such as fluidized bed method, electroless plating method and the like can be used. Among these methods, electroless plating method is particularly preferable, because it uses a wet dispersed system and therefore can give a coating layer of uniform thickness. Thickness of metal thin layer is usually 0.01 to 5 microns and preferably 0.05 to 1.0 micron. When a metallic substrate layer is provided, the term "thickness" used herein involves thickness of the substrate layer, too. If thickness of coating layer is too small, electrical conductivity lowers. If the thickness is too great, the polymeric nuclear material at the time of circuit connection becomes difficult to deform, so that reliability of connection is deteriorated.

As the pressure-deformable electroconductive particle 3 of this invention, not only the above-mentioned polymeric nuclear material/metallic thin layer structure but also some thermally fusible metal particles can be used, so far as they can be deformed under the condition of heating and pressing without breaking protecting layer 13 of semiconductor chip.

When pressure-deformable electroconductive particle 3 is used for circuit connection, the connection can follow the expansion and contraction between circuits 4 and 5 for the reasons that the polymeric nuclear material is deformed by the pressure or by the heat and pressure applied at the time of connection so that the pressure-deformable electroconductive particles press one another to maintain a sufficient contact area and that the polymeric nuclear material is close to the adhesive in rigidity and thermal expansion coefficient and the metallic thin layer has so a small thickness of 1 micron or below and therefore is deformable. Thus, reliability of connection is markedly improved for a long period of time even if temperature is changed in the period.

Before deformation, the pressure-deformable electroconductive particle of this invention has preferably a mean particle diameter of 0.01 to 100 microns. If the mean particle diameter is smaller than 0.01 micron, surface area of the particle is too great and particle-particle contact is excessively promoted due to agglomeration, as the result of which insulation between adjacent two circuits can be deteriorated.

If the mean particle diameter exceeds 100 microns, insulation between adjacent two circuits can be deteriorated when the circuits are fine and particles exist between adjacent circuits.

For these reasons, preferable mean particle diameter is 1 to 50 microns.

The shape of the pressure-deformable electroconductive particle is not critical, so far as its mean particle diameter is in the above-mentioned range. For obtaining a good anisotropic conductivity, however, pressure-deformable electroconductive particles having as small an aspect ratio as possible are preferable. For example, pressure-deformable electroconductive particles having a spherical or conical shape are preferable.

These pressure-deformable electroconductive particles may be used either alone or in combination of two or more kinds.

The pressure-deformable electroconductive particle of this invention is used in an amount of 0.1 to 15% by volume based on the volume of the adhesive component. Although a good anisotropic electroconductivity can be exhibited so far as its amount is in the range of 0.1 to 15% by volume, conductivity in the direction of thickness is deteriorated if its amount is smaller than 0.1% by volume and insulation between neighboring circuits is deteriorated if its amount exceeds 15% by volume in order to obtain a highly reliable anisotropic electroconductivity.

For these reasons, it is more preferable to keep the amount of pressure-deformable electroconductive particle in the range of 1 to 10% by volume.

From the viewpoint of preventing the corrosion of connected circuits and improving the reliability of connection, the chlorine ion concentration in the aqueous extract solution obtained by dipping a composition for circuit connection of this invention into pure water and treating it at 100° C. for 10 hours should be 15 ppm or below, and preferably 5 ppm or below, based on the weight of the composition.

Further, lowering the chlorine ion concentration in aqueous extract solution is desirable from the viewpoint of workability of connection, because it improves reaction velocity of composition and thereby lowers connection temperature and shortens the time period necessary for connection, as has been mentioned above.

Next, the connected structure of semiconductor chip and circuit base board prepared by the use of the above-mentioned composition for circuit connection will be explained in cases of bumpless and bump-carrying semiconductor chips.

In the first place, the bumpless connection of semiconductor chip will be explained with reference to FIGS. 5–7.

Figure 5:
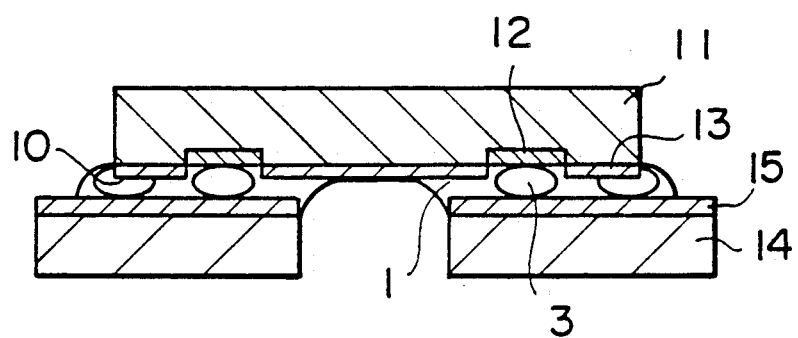
FIGS. 5 and 6 are sectional diagrams illustrating the bumpless connection structure of semiconductor chips according to one example of this invention.
Figure 6:
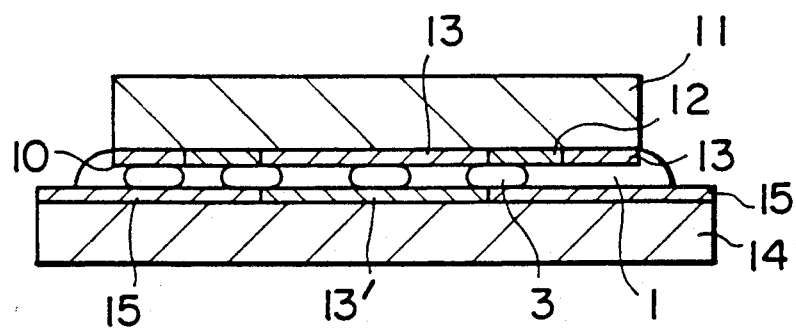

FIGS. 5 and 6 are sectional diagrams illustrating one embodiment of this invention. Semiconductor chip 11 is IC, LSI, chip condenser, or the like. On these semiconductor chips, electrode 12 made of aluminum, copper, nickel or the like or additionally having a layer of gold thereon is formed either concavely or on the nearly same level as the main surface 10 of protecting layer 13. As electrode 12, the wiring of semiconductor chip may be used as it is, if desired.

A case that the depth of electrode is comparable to thickness of protecting layer (FIG. 6) corresponds to a case in which protecting layer 13 is formed in the necessary part by the use of the so-called thin-film making technique such as CVD, or a case in which wiring circuit is not covered by protecting layer.

Board 14 is made of glass, synthetic resin, metal ceramic or their composite material and has circuit 15 made of gold, silver, copper, aluminum, chromium, tantalum, indium oxide (ITO) or the like. Board 14 can have a structure of FIG. 5 where the central part is removed (e.g. film carrier or the so-called TAB) or a continuous structure of FIG. 6 (e.g. glass circuit), for example.

In FIGS. 5 and 6, combination of a semiconductor chip and a board is not limited to the above. For example, it is also possible to apply a semiconductor chip having a concave electrode shown in FIG. 5 to a continuous board shown in FIG. 6.

Figure 7:
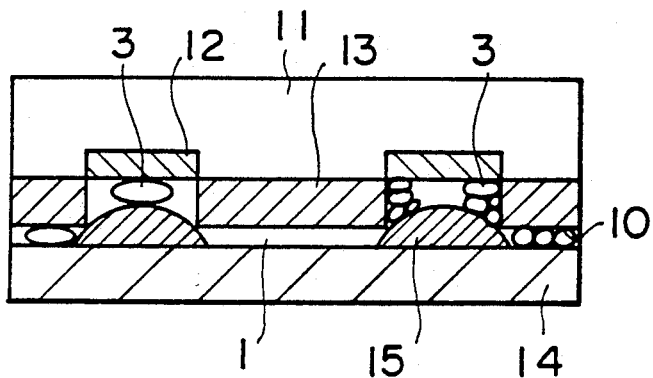
FIG. 7 is a sectional diagram illustrating the connection structure of semiconductor chips according to another example of this invention.

Next, FIG. 7 illustrating another embodiment of this invention will be explained. FIG. 7 is a sectional diagram illustrating a case in which a semiconductor chip having concave electrode 12 is connected to circuit 15 formed on synthetic resin film substrate 14 by the use of silver paste.

A structure in which the central part is swollen is often formed in the circuits using silver paste or when the conditions of etching are not appropriate at the time of circuit preparation.

In FIG. 7, circuit 15 is swollen in its central part. Thus, protecting layer 13 functions as a dam, and pressure-deformable electroconductive particles 3 cannot flow into the insulated circuit at the time of pressing. As a result, a good electrical continuity is obtained and a high insulation can be realized between protecting layer 13 and board 14. FIG. 7 (a) and (b) demonstrate that pressure-deformable electroconductive particles 3 existing between electrode connection parts 12 and 15 may be any of monodispersed particle (a) and agglomerated particle (b).

In obtaining the connected structure of this invention, a composition for circuit connection of this invention is placed between semiconductor chip 11 and board 14 and positions of electrode 12 and circuit 15 are adjusted, after which the whole is heated and pressed.

If desired, ultraviolet irradiation or ultrasonic vibration may optionally be used in combination at the time of connection. This is effective for shortening the curing time of adhesive and removing the pollution on the surfaces to be bonded.

This invention provides a structure in which particles deformable under the condition of heating and pressing at the time of connection are used as the conductive particles in an adhesive for circuit connection and the particles are immobilized by means of adhesive at the time of connection. Since the deformable particles can change their form in accordance with the unevenness of bonding surface, the deformable particles can give an electrical connection even when no bump is present in the electrical connection part, because the deformable particles function similarly to bump. In addition, the connecting work can be simplified because the unevenness in the depth of electrode from the protecting layer can be neglected.

Since the deformable electroconductive particles are lower in strength than the materials constituting semiconductor chip and protecting layer, the semiconductor chip and protecting layer are not broken by the heat and pressure applied at the time of connection. Accordingly, a high density connection having an insulating property between adjacent two circuits and conductive only in the direction of up-and-down electrodes can be realized by appropriately selecting particle diameter of conductive particle and its amount. Thus, bumpless connection of semiconductor chips which has hitherto been impossible can be realized.

Further, in case of the so far known so-called flip chip method in which the connecting part is formed from solder, all the stresses due to difference in thermal expansion coefficient between semiconductor chip and board are concentrated into the connecting part made of solder. According to this invention, contrariwise, the conductive particle contains a polymeric substance as its nuclear material and the surface metallic layer has a very small thickness. Since it is close to adhesive in elastic modulus and thermal expansion coefficient because both the materials belong to polymeric substances, the connection layer made of anisotropically conductive adhesive behaves as an excellent stress-absorber to the thermal shock, owing to which the reliability of connection is improved.

Further, since no step for fusion of solder is necessary at the time of connection, the semiconductor chip and its neighboring electronic parts are not thermally injured and no solder bridge is formed, owing to which an additionally high density fitting can be achieved.

If desired, the connected structure obtained above may be sealed with other synthetic resin or ceramic. This is desirable from the viewpoint of mechanical reinforcement of connected part and formation of moisture-proofing layer.

Next, the case of bump-carrying semiconductor chip will be explained with reference to drawings.

Figure 8:
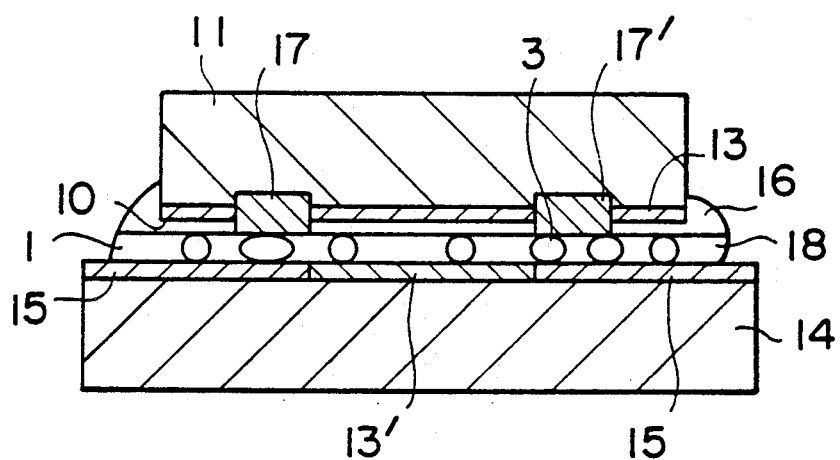
FIG. 8 is a sectional diagram illustrating the connection structure of bump-carrying semiconductor chips according to another example of this invention.
Figure 9:
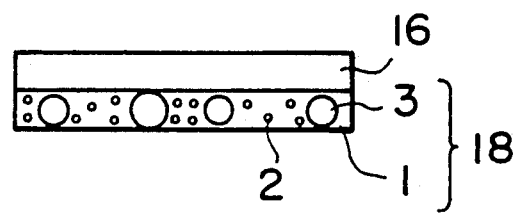
FIG. 9 is a sectional diagram illustrating a double layer film suitable for obtaining the connection structure of FIG. 8.

FIG. 8 is a sectional diagram illustrating one embodiment of this invention. On semiconductor chip 11, an number of electrodes 17, 17' (typically, bumps) made of gold or solder protruded from the main surface are formed.

According to this invention, circuit 15 is connected to semiconductor bumps 17, 17' through intermediation of circuit connection composition placed on circuit 15. At this time, their whole under surface except for the connecting part of bump of semiconductor chip is covered with insulating adhesive 16.

The insulating adhesive 16 must cover at least the semiconductor chip side of the surface on which bumps 17 and 17' are formed.

The production of the connected structure of bump-carrying semiconductor chip of this invention will be explained below.

In FIG. 8, a circuit connection composition 18 of this invention is formed on a board 14 having circuit 15. When the composition is liquid, it is formed by coating or printing. When the composition is solid, it is mounted on board and pressed or heated and pressed. On the other hand, insulating adhesive 16 is constructed on the bump (17, 17') side of semiconductor chip 11. Thereafter, both the adhesive surfaces are confronted each other and pressed or heated and pressed to integrate the both adhesive surfaces. According to this invention, an insulating adhesive layer can be formed relatively easily.

As another method, only the protruded electrode part may be connected to composition 18 by controlling thickness of base board or height of bumps 17 and 17', so as to form a gap in the semiconductor chip 11 side. Then, an insulating adhesive 16 is formed in the part of gap. It is formed by immersion in insulating adhesive 16, injection of insulating adhesive under pressure or reduced pressure, etc.

Next a method using a double layer film will be explained. According to this method, semiconductor chip and board are connected by placing a double layer film constructed of a circuit-connecting composition 18 and an insulating adhesive 16 so that the circuit connecting composition layer faces the board and applying thereto pressure or heat and pressure.

The double layer film is prepared by, for example, constructing a layer of circuit connecting composition 18 consisting of adhesive 1, coated particle 2 and pressure-deformable conductive particle 3 by the method of coating or the like onto a peelable film, followed by, for example, coating an insulating adhesive 16 thereon. Otherwise, it is prepared by roll-laminating both the films.

According to the latter method, workability can be greatly improved as compared with the former method, because it is unnecessary to prepare the insulating adhesive elsewhere before connection.

In obtaining a connected structure of this invention, it is important to make the fluidity of insulating adhesive 16 at the time of connection at least comparable to or greater than that of the circuit-connecting composition 18 in order to promote the contact between the tips of bumps 17, 17' and circuit-connecting composition 18. A good connection can be achieved when thickness of insulating adhesive 16 is not greater than the height of bumps 17, 17', preferably not higher than a height giving a volume excepting the bumps 17 and 17'. Thickness of the circuit connecting composition 18 is preferably comparable to the particle diameter of the conductive particle contained in the composition or smaller than it, because in this state the conductive particles can effectively contribute to the electrical continuity.

According to the connected structure of this invention, the connected part is made into a double layer structure consisting of a layer of circuit-connecting composition 18 contributing to electroconductivity and a layer of insulating adhesive 16. By this, connection resolution can be improved to a great extent, and short-circuit between adjacent circuits can be eliminated in the connection of fine circuits of semiconductor chips.

Thus, in the connection of bumps 17, 17' and circuit 15, the tip surface of bumps 17, 17' comes into contact with the pressure-deformable electroconductive particle 3 contained in circuit-connecting composition 18 and functions as concavity-convexity forming material on electrode, so that reliability of connection in minute area can be improved.

Between the connection parts 13 and 15, the existence of insulating adhesive 16 prevents the leakage between adjacent bumps 17 and 17'. Thus, electroconductive particles can be packed at a higher density than in the prior techniques and thereby reliability of connection in minute area can be improved.

At this time, composition 18 and insulating adhesive 16 constitute separate phases as shown in Figure 8. However, if both the materials exist as a solution or mixture in the space between bumps, concentration of conductive particle 3 decreases relatively, and this state is more preferable.

Further, according to this connected structure, the bump (17, 17')-carrying surface (connection surface of chip side) is covered with insulating adhesive 16 containing no conductive particle. This insulating adhesive 16 functions as a buffer layer under the pressure applied at the time of connection and prevents the chip from breakage.

The insulating adhesive 16 also exhibits an effect of sealing agent and is effective for prevention of water invasion and improvement of moisture resistance. Further, since the pressure-deformable electroconductive particle 3 areally contacts with circuit and it is approximately equal to nuclear material of conductive particle in thermal expansion coefficient and elastic modulus, reliability of connection is remarkably improved.

As has been mentioned above, the connected structure of semiconductor chip of this invention greatly contributes to the field of high density fitting such as display materials (e.g. liquid crystal, ELI fluorescent display tube and the like), IC card, printer and the like, in each of bumpless and bump-carrying semiconductor chips.

In the connection mentioned above, only one semiconductor chip has been used. However, the so-called multi-chip fitting, i.e. simultaneous connection of many semiconductor chips on one board, successive lamination and integration of another semiconductor chip on one semiconductor chip, etc. can also be practiced according to this invention.

Further, a method which comprises temporarily forming the construction of this invention by patting the uncured (B stage) composition on wafer electrode surface for the sake of temporary fixation at the time of dividing the wafer into chips or for preventing electrostatic breakage or for testing electrical continuity, followed by forming a chip therefrom to obtain a structure of this invention is also desirable from the viewpoint of shortening the process.

According to this invention, pressure-deformable electroconductive particle 3 is preferentially deformed because its particle diameter is larger than that of coated particle 2 and preferentially accepts the pressure at the time of connection. At this time, reactive adhesive 1 has already decreased its viscosity due to the high temperature and therefore is easily removable from the surface of pressure-deformable electroconductive particle 3. Further, the pressure-deformable electroconductive particle 3 can freely change its form while keeping contact with circuit. Since coated particle 2 has a smaller particle diameter than pressure-deformable electroconductive particle 3, it reaches high temperature later than pressure-deformable electroconductive particle 3, and at this high temperature the protecting layer is broken or molten and the nuclear material or the curing agent comes into contact with reactive adhesive 1. Due to the high temperature, the curing reaction progresses rapidly. Thus, the pressure-deformable electroconductive particles can be immobilized between circuits while keeping their deformed state, which makes their contact with circuit sufficient and thereby enables to realize a stable connection free from dispersion of contact resistance.

Accordingly, the technique of this invention is applicable to the fields requiring high connection reliability such as electrical connection between semiconductor chip and circuit on board, and the like.

Next, this invention will be illustrated in more detail by way of the following examples.

EXAMPLE 1

(1) Adhesive

Epikote 1002 (bisphenol type epoxy resin, manufactured by Yuka Shell Epoxy Co., Ltd.) and Nipol 1072 (carboxyl-modified nitrile rubber, manufactured by Nippon Geon Co., Ltd.) were mixed together at a solid component ratio of 70 : 30 and made into a 40% solution in toluene.

(2) Coated particle

Novacure (a dispersion prepared by coating and micro-encapsulating modified imidazole used as a nuclear material with crosslinked polyurethane to obtain microcapsule having a mean particle diameter of 2.5 microns and dispersing the microcapsules into a liquid epoxy resin; manufactured by Asahi Chemical Industry Co., Ltd.) was used.

(3) Pressure-deformable electroconductive particle

The surface of a cured product of flexible epoxy resin having a spherical shape was subjected to electroless plating to obtain a particle having a particle diameter of 5.2 microns (referred to as "EP-M"). Thickness of the nickel layer was 0.1 micron.

(4) Preparation of connecting material

The above-mentioned materials (1)-(3) were compounded at a compounding ratio shown in Table 1, and the solution thus obtained was coated onto a biaxially stretched polypropylene film (50 microns) and dried at 90° C. for 15 minutes to obtain a film-form connecting material having a thickness of 25 microns. In order to evaluate the properties of the connecting material after a longterm storage at ambient temperature, all the connecting materials thus prepared were aged at 50° C. for 20 hours and thereafter evaluated.

The concentration of extracted chlorine ion after extraction with pure water at 100° C. for 10 hours was 3 ppm, as measured by ion chromatography using Dionex 2010i. On the other hand, 1.5 mg of the connecting material was weighed out and its temperature was elevated at a rate of 10° C./minute in DSC (Du Pont 1090). The exotherm peak temperature was 148° C.

(5) Evaluation

Using the connecting material, a flexible circuit board (FPC) having 250 copper circuits each having a line width of 70 microns, a pitch of 140 microns and a thickness of 35 microns was connected to a glass plate having a thickness of 1.1 mm and having a thin layer of indium oxide (ITO) on its whole area (surface resistance 30 ohms/□) by heating and pressing them (170° C. −20 kg/cm² for 30 seconds) at a connection width of 3 mm. At this time, the adhesive surface of connecting material was first applied onto FPC, at 100° C., 5 kg/cm² for 3 seconds, and thereafter the separator (polypropylene film) was peeled off and connection to ITO was carried out. The connected circuit thus obtained was evaluated to obtain the results shown in Table 1.

In Table 1, thickness after connection was determined by first measuring the thickness of connecting part by means of micrometer and subtracting therefrom the thicknesses of FPC and ITO glass plate which had previously been measured.

In Table 1, connection resistance is expressed by average value (x) and maximum (Max) determined by measuring the resistance of adjacent circuits by means of multimeter.

they were contacted with the circuit surface areally as shown in FIG. 1 (c).

Since the coating film of the coated Particle used in Example 1 was made of crosslinked polyurethane, it was resistant to toluene so that no trouble apPeared in the production. When the product was aged at 50° C. for 20 hours in order to evaluate its behavior in long-term storage, good properties were observed.

EXAMPLE 2

The procedure of Example 1 was repeated, except that spherical silica having a particle diameter of 2 microns (manufactured by Catalysts & Chemicals Ind. Co., Ltd.) was additionally added to the connecting material.

The product was evaluated in the same manner as in Example 1. It was found that thickness of connection was controllable by changing the particle diameter of the spherical silica. The spherical silica behaved as a gap regulator to give good connection characteristics. It is considered that the method of this example will be

TABLE 1

| No. | Ingredients of composition | | | |
|---|---|---|---|---|
| | Adhesive | Coated particle | Pressure-deformable conductive particle | Gap regulator |
| Example 1 | 1002/1072 = 70/30 | HX-3742, 2.5 μm, 20% by vol. | EP-M, 5.2 μm 1% by vol. | — |
| Example 2 | 1002/1072 = 70/30 | HX-3742, 2.5 μm, 20% by vol. | EP-M, 5.2 μm 1% by vol. | Spherical silica, 2.0 μm, 1% by vol. |
| Example 3 | 300/828/Colonate L = 70/30/1 | HX-3742, 2.5 μm, 20% by vol. | EP-M, 5.2 μm 1% by vol. | — |
| Example 4 | 1002/1072 = 70/30 | 2MZ-OK/Cu, 4.2 μm, 10% by vol. | PSt-M, 10.4 μm, 10% by vol. | — |
| Example 5 | 1002/1072 = 70/30 | 2MZ-OK/Cu, 72. μm, 10% by vol. | PSt-M, 10.4 μm, 10% by vol. | — |
| Comparative Example 1 | 1002/1072 = 70/30 | 2MZ-OK/Cu, 15.2 μm, 10% by vol. | PSt-M, 10.4 μm, 10% by vol. | — |
| Comparative Example 2 | 1002/1072 = 70/30 | 2MZ-OK/No coating, 7.2 μm, 10% by vol. | PSt-M, 10.4 μm, 10% by vol. | — |
| Example 6 | 1010/3000K = 70/30 | HX-3741 HP, 4.5 μm, 20% by vol. | PH-M, 15.2 μm, 5% by vol. | — |
| Example 7 | 1010/3000K = 70/30 | HX-3741 HP, 4.5 μm, 20% by vol. | PH-M, 15.2 μm, 5% by vol. | Spherical silica, 2.0 μm, 1% by vol. |
| Example 8 | 2010/3000K = 70/30 | HX-3741 HP, 4.5 μm, 20% by vol. | PH-M, 15.2 μm, 5% by vol. | — |
| Referential Example 1 | 828/3000K = 70/30 | HX-3741 HP, 4.5 μm, 20% by vol. | PH-M, 15.2 μm, 5% by vol. | — |

| No. | Properties | | | | |
|---|---|---|---|---|---|
| | Thermal activation temperature (°C.) | Extracted Cl ion concentration (ppm) | Thickness after connection (μm) | Connection resistance (Ω) | |
| | | | | x | Max |
| Example 1 | 148 | 13 | 1 | 2.1 | 2.8 |
| Example 2 | — | — | 2 | 2.0 | 2.5 |
| Example 3 | 145 | 5 | 3 | 2.2 | 2.9 |
| Example 4 | 170 | — | 2 | 2.0 | 2.5 |
| Example 5 | — | — | 3 | 2.1 | 3.0 |
| Comparative Example 1 | — | — | 20 | 20 | 150 |
| Comparative Example 2 | — | — | 23 | 12 | 120 |
| Example 6 | 120 | 3 | 1 | 2.0 | 2.5 |
| Example 7 | — | — | 2 | 1.9 | 2.3 |
| Example 8 | 115 | 2 | 1 | 2.0 | 2.4 |
| Referential Example 1 | 147 | 40 | 1 | 2.0 | 2.8 |

In Example 1, thickness of the connecting part was as small as about 1 micron, and a good connection resistance was obtained.

Section of the connected structure was observed by means of scanning electron microscope. As a result, it was revealed that all the electroconductive particles were greatly deformed in the direction of pressing and more effective when the pressure-deformable electroconductive particle is particularly easily deformable.

EXAMPLE 3

The procedure of Example 1 was repeated, except that the adhesive component was altered. That is, Bylon 300 (thermoplastic polyester having hydroxyl and carboxyl groups, manufactured by Toyobo Co., Ltd.), Epikote 828 (bisphenol A type liquid epoxy resin manufactured by Yuka Shell Co., Ltd.) and Colonate L (polyisocyanate, manufactured by Nippon Polyurethane Co., Ltd.) were used at a compounding ratio of 70/30/1.

In this example, the adhesive system was different from that of Example 1. As shown in Table 1, good connection characteristics were achieved.

EXAMPLE 4-5 AND COMPARATIVE EXAMPLES 1-2

In these examples, the same adhesive as in Example 1 was used, while coated particle and pressure-deformable electroconductive particle were different from those of Example 1.

(1) Adhesive

The same as in Example 1.

(2) Coated particle

(a) Pretreatment

Curezole 2MZ-OK (2-ethylimidazole-isocyanuric acid adduct, mp ca. 250° C., manufactured by Shikoku Chemical Ind. Co., Ltd.) was fractionated by sieving to obtain powdery curing agent materials having mean particle diameters of 4.7 microns and 15 microns, respectively. Each of the powdery materials was forcibly stirred in toluene as a pretreatment for the sake of defatting and making the particles more coarse. By filtering off the toluene, pretreated nuclear materials (curing agents) were obtained.

(b) Activation

Then, the powdery material was dispersed into Circuit prep 3316 (PdCl+Cl+HCl+SnCl$_2$ type activating treating solution, manufactured by Nippon Electroplating Engineers Co., Ltd.) and stirred at 25° C. for 20 minutes for sake of activation, after which it was washed with water and filtered to obtain a nuclear material having activated surface.

(c) Electroless copper plating

The nuclear material having been subjected to activating treatment was dipped in Circuitprep 5501 (electroless plating solution manufactured by Nippon Electroless Plating Engineers Co., Ltd) and forcibly stirred at 30° C. for 30 minutes. After allowing it to stand for a predetermined period of time, it was washed with water and dried to obtain a particulate material having a copper coating layer (about 0.1 micron in thickness as measured by sectional examination using scanning electron microscope) on the nuclear material.

(3) Pressure-deformable electroconductive particle

A nickel layer was formed on the surface of crosslinked polystyrene particle (PSt) having a mean particle diameter of 10 microns by the method of electroless plating, after which a substituting plating using gold was carried out. Thus, a metal plated plastic particle (hereinafter, referred to as "PSt-M"; specific gravity 2.0) having a metal coating layer of about 0.2 micron was obtained.

(4) Evaluation

Table 1 illustrates the results of evaluation carried out in the same manner as in Example 1.

In Table 1, Examples 4 and 5 are cases in which the pressure-deformable electroconductive particle both had a mean particle diameter of 10.4 microns before deformation, while coated particle of Example 4 had a mean particle diameter of 4.2 microns and that of Example 5 had a mean particle diameter of 7.2 microns. In both Examples, the thickness after connection was as small as 2 to 3 microns and the electroconductive particles were sufficiently deformed, so that connection resistance was also low in both x and Max, and the results were good.

In Examples 4 and 5, a metal was used as coating material of coated particle. Owing to it, the coated particle was resistant to the influence of solvent present in adhesive and showed only a small viscosity change at the time of producing connecting material, so that the production was easy to practice. After the connection, the coating metal functioned as a conductive material and exhibited no adverse influence.

In Comparative Example 1, particle diameter of coated particle was 15.2 microns, which was greater than the mean particle diameter of pressure-deformable electroconductive particle (10.4 microns). In this example, thickness after connection hardly decreased, and the connection resistance was unstable.

Probably, this was due to that viscosity of adhesive increased because a curing reaction took place at a stage that the deformation of pressure-deformable electroconductive particle and its contact with circuit were both insufficient yet.

COMPARATIVE EXAMPLE 2

The connecting material used in this example had a similar formulation to that of Example 2, although the coated particle used in this example was a powder of curing agent only subjected to no coating treatment.

In this case, thickness after coating did not decreased, and connection resistance was very unstable. This was probably due to that curing reaction of adhesive progressed in course of storage (at 50° C. for 20 hours) and therefore the adhesive had nearly lost fluidity at the time of circuit connection.

In Examples 1-5 mentioned above, the deformation of pressure-deformable electroconductive particle was accompanied by a decrease in the viscosity of adhesive due to the high temperature used at the time of connection. However, the pressure-deformable electroconductive particle, put between circuits, could not flow out of the circuit and could be deformed readily.

After deformation of the pressure-deformable electroconductive particle, viscosity of reactive adhesive ascended, so that a stable connection could be achieved.

As a result, in all the connected products, no short circuit took place between the adjacent circuits (FPC, space 70 microns), and a good anisotropic electroconductivity was observed.

Since the adhesive used in these examples was of reaction-curable type, the high adhesive strength was maintained up to high temperatures, and a good state of connection was observed.

EXAMPLES 6-8 AND REFERENTIAL EXAMPLE 1

In this example, the influence of chlorine ion extracted from adhesive was examined.

(1) Adhesive

As commercial epoxy resin of superhigh purity grade, Quatlex 1010 (bisphenol type epoxy resin, manufactured by Dow Chemicals Co., Ltd.) and Quatlex 2010 (novolac phenol type epoxy resin manufactured by Dow Chemicals Corp.) were used. As flexibilizing agent for epoxy resin, Butyral 3000K (polyvinyl acetal resin, manufactured by Denki Kagaku Kogyo K.K.) was blended with the epoxy resin at a ratio of 30% by weight (weight of solid component) based on the epoxy resin, and a 40% (solid component) solution in toluene was prepared.

(2) Coated particle

Among the commercial products, Novacure HX-3741HP (a dispersion prepared by coating a modified imidazole as a nuclear material with a polyurethane type material to obtain a particle material having a mean particle diameter of 4.5 microns and then dispersing the particle material into a high purity liquid epoxy resin; manufactured by Asahi Chemical Industry Co., Ltd.) was selected in Examples 6-8, while HX-3741 (a dispersion of the same curing agent as above in general purpose type liquid epoxy resin) was used in Referential Example 1.

(3) Pressure-deformable electroconductive particle

As polymeric nuclear material, soft phenol particle was used. A composite plating layer of nickel/ gold was formed on its surface to prepare an electroconductive particle having a mean particle diameter of 15.2 microns.

(4) Preparation of connecting material

In the same manner as in Example 1, a film of anisotropic electroconductive adhesive having a thickness of 17 microns was prepared.

(5) Evaluation

Evaluation was carried out in the same manner as in Example 1 to obtain the results shown in Table 1.

As compared with Referential Example 1, Examples 6 and 8 were lower in chlorine ion concentration (1/10 or below) and DSC peak temperature was about 30° C. lower, demonstrating that decrease in the concentration of chlorine ion brought about an improvement in reactivity. In Example 7, the same gap regulator as in Example 2 was used. Examples 6 to 8 all exhibited good connection resistance.

Thus, the connected products of Examples 6-8 and Referential Example 1 were subjected to a pressure cooler test (PCT). After a treatment for 200 hours, the resistance was measured.

As a result, Examples 6-8 all exhibited a Max resistance of 10 ohms or below and showed only a small change in connection resistance, while Referential Example 1 exhibited as high a Max resistance of 30 ohms and showed a greater change in connection resistance than in Examples 6-8. This is probably for the reasons that, in Examples 6-8, reactivity was higher and therefore curing reaction progressed more sufficiently than in Referential Example 1, and that corrosion of electrode surface in the connected part was prevented by the lowered concentration of chlorine ion in Examples 6-8.

EXAMPLE 9-11

A semiconductor chip (5 mm square, thickness 0.5 mm, with 200 electrodes of 50 microns square formed in four sides of main surface, electrode distance 50 microns in the shortest part, thickness of protecting layer 10.2 and 0 micron in Examples 9, 10 and 11, respectively) and a circuit glass board having an ITO (indium oxide) circuit corresponding to the above-mentioned electrode arrangement were prepared.

A film-form connecting material composed of the circuit-connecting adhesive composition of Example 1 was placed between the semiconductor chip and the circuit, and the whole was heated and pressed at 170° C., 30 kg/cm$^2$ for 30 seconds to cure the adhesive. Thus, a connected structure was obtained.

In the above-mentioned connected structure, all the connection points of electrodes showed an electrical continuity, and the result did not change even after a thermal shock test ($-40°$ C. to 100° C., 500 cycles).

After the thermal shock test, section of the connected structure was examined by means of scanning electron microscope. As a result, it was revealed that the electroconductive particles in the connection surface were all greatly deformed in the direction of pressing, and extent of the deformation increased in the order of Examples 9, 10 and 11 or, in other words, as thickness of protecting layer decreased.

EXAMPLE 12

The same semiconductor chip as used in Example 10 was connected to a TAB tape having 15 microns copper circuit on a 75 microns polyimide film. The circuit-connecting composition and the conditions of connection were the same as in Example 10. In this case, too, a good connection could be achieved.

According to Examples 9 to 12, the connection was carried out by a simple method which comprises pressing or heating and pressing the electrode part of semiconductor chip and circuit part of board without forming any bump on them, and this makes it possible to carry out a high-reliability bumpless connection of semiconductor chips, and thereby to simplify the process to a great extent.

It is also possible, according to this invention, to achieve excellent effects such as imprevement of fitting density (connection resolution), reduction of cost, etc. simultaneously.

EXAMPLE 13

In this example, a case in which the circuit-connecting composition and the insulating adhesive are film-form materials will be mentioned. As have been mentioned above, these materials may also have a liquid or other form.

A circuit board was prepared by forming, on a glass plate, an ITO circuit having connection terminals of which arrangement corresponded to that of bumps (protruded electrode) of semiconductor chip (5 mm square, thickness 0.5 mm, with 200 bumps (20 microns in height) formed on the four sides of the main surface). On the other hand, as a circuit-connecting composition, a film-form composition having a thickness of 7 microns and the same formulation as in Example 3 (initial viscosity $1 \times 10^4$ poises at 170° C.) was prepared. It was applied onto the circuit of glass board at room temperature under a pressure of 5 kg/cm² in 5 seconds.

On the other hand, as an insulating film, a composition of Example 1 from which the pressure-deformable electroconductive particle was subtracted (thickness 20 microns, initial viscosity $2 \times 10^2$ poises at 170° C.) was applied to semiconductor chip surface at room temperature under a pressure of 5 kg/cm² in 5 seconds.

Both the adhesive surfaces were adjusted to correct position and connected together by heating and pressing them at 170° C. under 30 kg/cm² for 30 seconds. The latent curing agent was activated to cure the adhesive.

Observation of section revealed that the space between adjacent electrodes of semiconductor chip was filled with particles of anisotropic electroconductive film and the particles were deformed, as shown in FIG. 8. Since viscosity of the insulating adhesive at the time of connection was lower than that of circuit-connecting composition, the tips of bumps excluded the surrounding insulating adhesive to come into contact with the electroconductive particles. Since the electroconductive particles in this part were deformable particles containing a polymer as nuclear material, it was flattened to increase the contact area with circuit. There was no risk of short circuit between neighboring bumps because concentration of electroconductive particle was low there.

According to Example 13, connection between a semiconductor chip having a high density electrode and a circuit could be practiced with a high reliability. Further, if a double layer film consisting of circuit-connecting composition and insulating adhesive is used, a more simple and convenient connection of semiconductor chip can be realized.

EXAMPLE 14

(1) Circuit-connecting composition

A film-form product having a thickness of 20 microns and having the formulation of Example 6 was used.

(2) Connection

A circuit board was prepared by forming, on a glass plate, an ITO/Cr circuit having connection terminals corresponding to the arrangement of bumps of semiconductor chip (5 mm square, height 0.5 mm, with 100 gold bumps formed on the four sides of its main surface).

The film-form product was applied onto the circuit board. After peeling off the polypropylene film, the positions of the bumps of semiconductor chip and the terminals of board were adjusted under microscope so as to mount 10 semiconductor chips on one sheet of circuit board. While heating and pressing the whole at 80° C. under a pressure of 20 kg/cm² (film is uncurved), the state of electrical continuity was examined by means of multimeter at a current of 10 micro-amperes, using measurement probe.

(3) Regeneration

By the above-mentioned continuity test, abnormality was found in one of the ten semiconductor chips. Thus, after releasing the pressure, the abnormal part was peeled off and replaced with a new chip, and then the above-mentioned procedure of connection was repeated. As a result, all the chips behaved normally. The abnormal part could be peeled off quite easily because the adhesive was uncured film, and the adhesive surface was clean.

(4) Cure

Since the continuity test under pressure gave a normal result, underside of the plate was heated with an infrared irradiation apparatus for 10 seconds. Maximum temperature of the heating was 190° C. According to this infrared irradiation apparatus, the heat emitted from heat source (xenon lamp) was concentrated by means of a lens and led to the vicinity of connected part by means of optical fiber with scarce loss. Accordingly, temperature could be elevated in a short period of time, and temperature could be lowered at will.

In the above-mentioned example, a continuity test could be effected by applying pressure at a temperature lower than the activation temperature of curing agent present in adhesive where the adhesive kept uncurved.

Further, since concentrated irradiation of infrared rays was adopted as the curing means at the time of connection, it was possible to complete the curing reaction of adhesive by elevating the temperature in a short period of time while maintaining the same state of pressing as in the continuity test.

According to this invention, continuity test can be effected before full bonding or in the state that the adhesive is not yet cured, which makes regeneration of defect part quite conveniently and easily. This is quite advantageous for labor saving of process and reduction of cost.

As has been detailed above, according to this invention, the particle diameter of pressure-deformable electroconductive particle is made larger than that of coated particle in the connecting material. Thus, upon heating and pressing the circuit connection part, viscosity of adhesive ascends after the pressure-deformable electroconductive particles had been deformed between the up and down circuits. Accordingly, insulating adhesive can be sufficiently removed from the surface of electroconductive particles, owing to which a stable connection free from dispersion of connection resistance and applicable to connection of minute areas can be realized.

Further, the thickness after connection can be controlled by the combined use of rigid particle.

For these reasons, this invention can provide a circuit-connecting composition quite advantageously applicable to the connection of electronic parts such as circuit board, semiconductor and the like of which circuits are becoming finer more and more today.

What is claimed is:

1. A composition for circuit connection comprising
   (A) an epoxy resin-containing reactive adhesive,
   (B) coated particles obtained by substantially coating a nucleus of a curing agent with a film, and
   (C) pressure-deformable electroconductive particles having an average particle size larger than that of the coated particles (B)
   the content of the electroconductive particles (C) being 0.1 to 15% by volume based on the total volume of the components (A) and (B), the composition having a chlorine ion concentration in extracted water of 15 ppm or less, and a thermal activation temperature of 40° to 250° C.

2. A composition for circuit connection comprising
   (A) an epoxy resin-containing reactive adhesive,
   (B) coated particles obtained by substantially coating a nucleus of a curing agent with a film, (C) pressure-deformable electroconductive particles having an average particle size larger than that of the coated particles (B), and (D) rigid particles having an average particle size smaller than that of the coated particles (B), the content of the electroconductive particles (D) being 0.1 to 15% by volume based on the total volume of the components (A) and (B), the composition having a chlorine ion concentration in extracted water of 15 ppm or less, and a thermal activation temperature of 40° to 250° C.

3. A composition according to claim 1, wherein the composition has a thermal activation temperature of 70° to 200° C.

4. A composition according to claim 2, wherein the composition has a thermal activation temperature of 70° to 200° C.

5. A bump-less connection structure of semiconductor chip comprising a semiconductor chip having an electrode portion with either (1) a concave form or (2) a height of almost a same height as a major surface of the chip, and connected electrically to a wiring substrate using an adhesive, said adhesive being the composition of claim 1, pressure-deformable electroconductive particles included in the composition being obtained by coating substantially a whole surface of a nucleus of a polymeric material with a metallic thin layer, said electroconductive particles being deformed at least at a position between the electrode portion of the semiconductor chip and circuits on the substrate, the connection structure being fixed by the adhesive.

6. A bump-less connection structure of semiconductor chip comprising a semiconductor chip having an electrode portion with either (1) a concave form or (2) a height almost a same height as a major surface of the chip, and connected electrically to a wiring substrate using an adhesive, said adhesive being the composition of claim 2, pressure-deformable electroconductive particles included in the composition being obtained by coating substantially a whole surface of a nucleus of a polymeric material with a metallic thin layer, said electroconductive particles being deformed at least at a location between the electrode portion of the semiconductor chip and a circuit on the substrate, the connection structure being fixed by the adhesive.

7. A connection structure of semiconductor chip comprising a semiconductor chip having an electrode projecting higher than a major surface of the semiconductor chip, the electrode being connected electrically to a wiring substrate using an adhesive, said adhesive being the composition of claim 1, pressure-deformable electroconductive particles included in the composition being deformed between an end portion of said electrode and a circuit on the substrate, the electrode being connected electrically to the wiring substrate at an electrode connected portion, at least portions of the major surface of the semiconductor chip except for the electrode connected portion being covered with an insulating adhesive.

8. A connection structure of semiconductor chip comprising a semiconductor chip having an electrode projecting higher than a major surface of the semiconductor chip, the electrode being connected electrically to a wiring substrate using an adhesive, said adhesive being the composition of claim 2, pressure-deformable electroconductive particles included in the composition being deformed between an end portion of said electrode and a circuit on the substrate, the electrode being connected electrically to the wiring substrate at an electrode connection portion, at least portions of the major surface of the semiconductor chip except for the electrode connected portion being covered with an insulating adhesive.

9. A composition according to claim 2, wherein the rigid particles are contained in the composition in an amount to 15% by volume based on the reactive adhesive.

10. A composition according to claim 1, wherein the reactive adhesive includes a thermoplastic polymer in addition to the epoxy resin.

11. A composition according to claim 1, wherein the average particle size of the coated particles (B) is at most 50% of the average particle size of the pressure-deformable electroconductive particles.

12. A composition according to claim 1, wherein the electroconductive particles have a mean particle diameter of 0.01 to 100 microns.

13. A double-layer adhesive film for circuit connection, comprising a first layer, of insulating adhesive, and a second layer, of said composition of claim 1.

14. A double-layer adhesive film according to claim 13, wherein fluidity of said insulating adhesive is greater than fluidity of said composition.

* * * * *